United States Patent [19]

Jessee

[11] 4,366,521
[45] Dec. 28, 1982

[54] SEQUENCE FILTERS FOR DETERMINING THE SYMMETRICAL COMPONENTS OF MULTIPHASE AC POWER SYSTEMS

[75] Inventor: Ralph D. Jessee, Shawnee Township, Allen County, Ohio

[73] Assignee: Westinghouse Electric Corp., Pittsburgh, Pa.

[21] Appl. No.: 126,092

[22] Filed: Feb. 29, 1980

[51] Int. Cl.³ .............................................. H02H 3/26
[52] U.S. Cl. ...................................... 361/76; 361/86; 324/108; 324/86
[58] Field of Search ....................... 361/76, 77, 86, 85; 324/86, 108, 107; 307/127, 232, 262; 318/621; 323/217, 218, 212; 328/133, 167, 128, 155

[56] References Cited

U.S. PATENT DOCUMENTS

| | | | |
|---|---|---|---|
| 2,836,771 | 5/1958 | Jessee | 361/76 |
| 3,184,681 | 5/1965 | Bloniarz | 323/217 X |
| 4,067,053 | 1/1978 | Chow | 361/76 |
| 4,146,913 | 3/1979 | Sun | 361/76 |
| 4,156,186 | 5/1979 | Wolfinger | 361/76 |
| 4,210,948 | 7/1980 | Waltz | 361/76 |

OTHER PUBLICATIONS

Transaction Paper No. 56-440 from *Applications and Industry*, No. 25, American Institute of Electrical Engineers, Jul. 1956.
Pp. 82, 83 and 90-97 of "Symmetrical Components" by L. J. Myatt, Pergamon Press, 1968.

*Primary Examiner*—Patrick R. Salce
*Attorney, Agent, or Firm*—R. P. Lenart

[57] ABSTRACT

Negative sequence filters employing one to three operational amplifiers and a single reactive element generate the negative sequence voltage of a three phase AC power system by generating two line-to-line voltages, phase shifting one of them to bring them into phase and summing the resultant signals. The phase shifting circuit includes a potentiometer, one end of which serves as the input to the circuit and the other end of which is connected to the inverting input of an operational amplifier. A capacitor is connected between the tap point of the potentiometer and ground and the values of the components are selected so that the tap point of the potentiometer can be positioned to compensate for variations in the capacitive reactance of the capacitor without affecting the magnitude of the phase shifted signal.

5 Claims, 5 Drawing Figures

SEQUENCE FILTERS FOR DETERMINING THE SYMMETRICAL COMPONENTS OF MULTIPHASE AC POWER SYSTEMS

BACKGROUND OF THE INVENTION

1. Field Of Invention

This invention relates to apparatus used in detecting and measuring the symmetrical components in multiphase AC electrical power systems and particularly to sequence filters which generate an output signal having a magnitude which is a function of the degree of imbalance in the power system.

2. Prior Art

It is common to represent the sinusoidal currents and voltages of a multiphase AC electrical power system as sets of rotating vectors, one set for the currents and another for the voltages. For a balanced system, the vectors of each set are equiangularly spaced and are of equal magnitude. For instance, in the commonly used three phase system the vectors of each set would be 120° apart. Since it is desirble from an efficiency standpoint to maintain the system in balance, an effort is made to balance the loads applied to each phase of the system. Under these circumstances, a serious imbalance in the system is then an indication of an abnormal condition, such as a short circuit, a fault, a failure in or loss of a load, or a failure in the multiphase electrical source. Detection of the imbalance then can be used as a warning of an abnormal condition and/or a trigger for initiating protective or corrective action.

The operation of a class of multiphase AC power system imbalance detectors, known as negative sequence filters, is based upon the principle that any set of rotating vectors, whether balanced or unbalanced, can be resolved into sets of balanced vectors equal in number to the number of phases in the system. For the three phase system, the three balanced sets of vectors are known as the positive sequence set, the negative sequence set and the zero sequence set. The positive sequence set includes three rotating vectors of equal magnitude and spaced 120° apart in phase which rotate in the same order as the line vectors. Thus in the case of a three phase system in which the phase order is a, b, c, the positive sequence vectors also rotate in the order a, b, c. The negative sequence vectors while also being of equal magnitude (although generally not of the same magnitude as the positive sequence vectors) and spaced 120° apart in phase, rotate in the order a, c, b or in the opposite order of the line vectors. The vectors of the zero sequence set are equal in magnitude and are all in phase. For a balanced system, the magnitudes of the negative sequence vectors and the zero sequence vectors are zero and the positive sequence vectors are identical to the line vectors. However, when there is an imbalance in the system, the magnitude of the negative sequence vectors increases as a function of the degree of imbalance. For a more complete discussion of positive, negative and zero sequence vectors, see *Circuit Analysis Of A-C Power Systems*, Volume I, by Edith Clarke, John Wiley & Son, Inc., New York 1943, and *Symmetrical Components*, by L. J. Myatt, Pergamon Press, 1968, Library of Congress Catalog Card No. 68-26942.

The negative sequence filter extracts the negative sequence voltage or current from the power system and uses it to operate a threshold device such as a current relay when the associated system imbalance reaches a preset level. Reactive components are used in the filters to achieve the phase shifting required to generate the negative sequence components. Many prior art negative sequence filters use two reactive elements. An example of such a prior art negative sequence filter is disclosed in an article coauthored by the present inventor and P. F. Boggess entitled "Negative-Sequence Voltage Detection On Aircraft" and appearing as Transaction Paper No. 56-440 in the July, 1956 issue No. 25 of Applications And Industry published by the American Institute of Electrical Engineers. A functionally similar negative sequence filter is disclosed in U.S. Pat. No. 2,836,771. Another prior art circuit for generating the negative sequence voltage is disclosed at page 82 in *Symmetrical Components* cited above. While this circuit, which is used only for measuring the negative sequence voltage, employs only one reactive element for phase shifting, it requires a pair of transformers which, of course, significantly adds to the cost of the system. A notable shortcoming of these and other prior art negative sequence filters is that they are dissipative, which becomes important on systems of limited capacity such as aircraft electrical systems.

It is therefore a primary object of the present invention to provide a sequence filter which is simple in design, economical to manufacture and efficient in use.

It is also an object of the invention to provide a sequence filter which is easily tuned through the use of economical precision components.

It is a more specific object of the invention to provide such a sequence filter which only employs one reactive element.

SUMMARY OF THE INVENTION

The present invention comprises a sequence filter which employs only one capacitor-resistor phase shifting network, does not utilize any transformers and yet dissipates very little power and is easily tuned. The apparatus includes means employing operational amplifiers to generate two line-to-line voltages and a phase shifting circuit which brings the two line-to-line voltages into phase and sums them to derive the negative sequence component. The phase shifting circuit comprises a potentiometer, a capacitor connected between the tap point of the potentiometer and ground and an operational amplifier connected in the inverting mode to a second end of the potentiometer. The line-to-line voltage to be phase shifted is connected to the first end of the potentiometer resistance. The arrangement is such that for the required 120° phase shift, the tap point on the potentiometer can be adjusted to compensate for variations in the effective capacitance of the capacitor without affecting the magnitude of the phase shifted signal. Thus a high priced precision capacitor is not required and at the same time very little power is dissipated by the circuit.

In one embodiment of the invention, the line-to-line voltages are generated by connecting the line voltages in pairs to the differential inputs of two additional operational amplifiers. The output of one such additional operational amplifier is applied to the first end of the potentiometer and the output of the other is applied to the input of the operational amplifier in the phase shifting circuit where it is summed with the phase shifted first line-to-line voltage.

In a second embodiment of the invention, one of the line-to-neutral voltages is applied to the inverting input of an operational amplifier with the output added to a second line-to-neutral voltage and the sum applied to the phase shifting circuit. The second line-to-line voltage is generated by applying the output of the first operational amplifier and the third line-to-neutral voltage to the summing input of a third operational amplifier. The output of the phase shifting network is also applied to the summing input of the third operational amplifier to generate the negative sequence voltage at the output of this third operational amplifier.

A third embodiment of the invention only uses one operational amplifier in addition to the one incorporated in the phase shifting circuit. First and second of the line-to-neutral voltages are applied to the inverting input of the additional operational amplifier. The output of this operational amplifier is summed with the first and third line-to-neutral voltages to provide the second to third line-to-line voltage which is then shifted 120° in phase by the phase shifting circuit. The output of the first operational amplifier is also applied together with the second line-to-neutral voltage to the inverting input of the operational amplifier in the phase shifting circuit to produce the second to first line-to-line voltage and to simultaneously sum it with the phase shifted second to third phase line-to-line voltage and therefore the negative sequence voltage.

DESCRIPTION OF THE PREFERRED EMBODIMENTS

Figure 1:
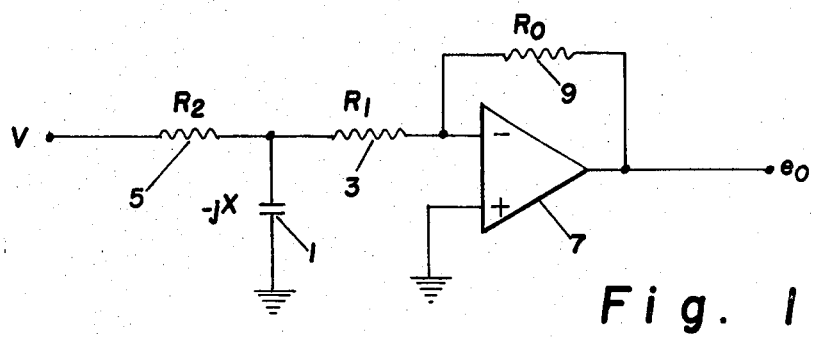
FIG. 1 is a schematic diagram of a phase shifting circuit in accordance with the teachings of the invention.

As set forth in the texts *Circuit Analysis Of A-C Power Systems* and *Symmetrical Components* cited above, the negative sequence voltage for a three phase AC system having line-to-neutral voltages $V_a$, $V_b$ and $V_c$ is defined as:

$$V_{2a} = (V_a + h^2 V_b + h V_c)/3 \quad (1)$$

where "h" is the complex operator and $$h = -\tfrac{1}{2} + j\sqrt{3/2} = 1 \angle 120° \text{ (for 120° phase shift)} \quad (2)$$

By squaring both sides of equation (2), adding h to the result and rearranging, it can be shown that:

$$h + h^2 + 1 = 0 \quad (3)$$

$$h^2 = -1 - h \quad (4)$$

And substituting back into equation 1:

$$3V_{2a} = (V_a - V_b) - h(V_b - V_c) \quad (5)$$

From equation (5), it is evident that the negative sequence voltage may be derived by phase shifting the line-to-line voltage, $-V_{bc}$, by 120° and adding it to line-to-line voltage, $V_{ab}$.

A phase shifting circuit in accordance with the invention is illustrated in FIG. 1 in which a capacitor 1 is connected between the junction of two resistors 3, 5 and ground. The resistors 3 and 5 are connected in series and to the inverting input of an operational amplifier 7 which is provided with a feedback resistor 9. The resistors 3, 5 and 9 and the capacitor 1 have the relative impedance indicated on the drawing.

The output voltage $e_o$ of the circuit of FIG. 1 is derived as follows:

$$e_o = -\frac{R_0}{Z_1} V_1 \quad (6)$$

where $$Z_1 = R_1 - \frac{jXR_2}{R_2 - jX} = \frac{R_1 R_2 - jX(R_1 + R_2)}{R_2 - jX} \quad (7)$$

and represents the impedance looking into the R-C circuit from the inverting input of the operational amplifier 7. The open circuit voltage of the R-C circuit is determined as follows:

$$V_1 = \frac{-jX}{R_2 - jX} \cdot V \quad (8)$$

where V is the voltage applied to the input of the phase shifting network.

Substituting equations (7) and (8) into equation (6):

$$e_o = \frac{jXR_0 V}{R_1 R_2 - jX(R_1 + R_2)} \quad (9)$$

Multiplying the numerator and denominator of equation (9) by $R_1 R_2 + jX(R_1 + R_2)$ $$e_o = \frac{-X(R_1 + R_2) + j R_1 R_2}{(R_1 R_2)^2 + X^2(R_1 + R_2)^2} \cdot XR_0 V \quad (10)$$

Referring back to equation (2) it can be seen that for a 120° phase shift $$R_1 R_2 = X(R_1 + R_2)\sqrt{3} \quad (11)$$

Substituting equation (11) into equation (10) and rearranging:

$$e_o = \frac{(-1 + j\sqrt{3}) X^2 (R_1 + R_2)}{(3X^2 + X^2)(R_1 + R_2)^2} \cdot R_0 V \quad (12)$$

which reduces to $$e_o = \frac{h}{2} \cdot \frac{R_0}{R_1 + R_2} \cdot V \quad (13)$$

Figure 2:
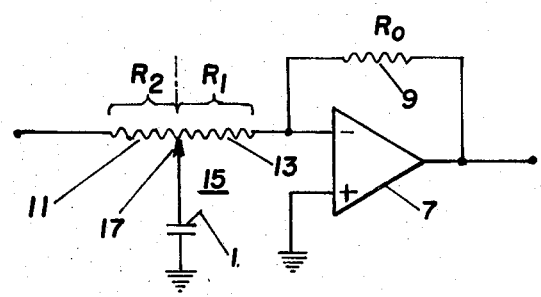
FIG. 2 is a schematic diagram of the phase shifting circuit of FIG. 1 modified to permit easy tuning of the circuit.

By examining equation (13) it is evident that $R_1$ and $R_2$ may be varied without affecting the value of $e_o$ as long as their sum is held constant. Translating this into a practical circuit, $R_1$ and $R_2$ may be the resistance values of the two legs 11 and 13 of a potentiometer 15 with the capacitor 1 connected to the tap point 17 as illustrated in FIG. 2. In this manner, the potentiometer may be used to compensate for the error in the nominal value of the capacitor which provides the reactive component ($-jX$) of $Z_1$. While the sum of $R_1$ and $R_2$ is held constant, the product $R_1R_2$ may be varied by the potentiometer to be proportional to the value of X as shown by equation (11).

Figure 3:
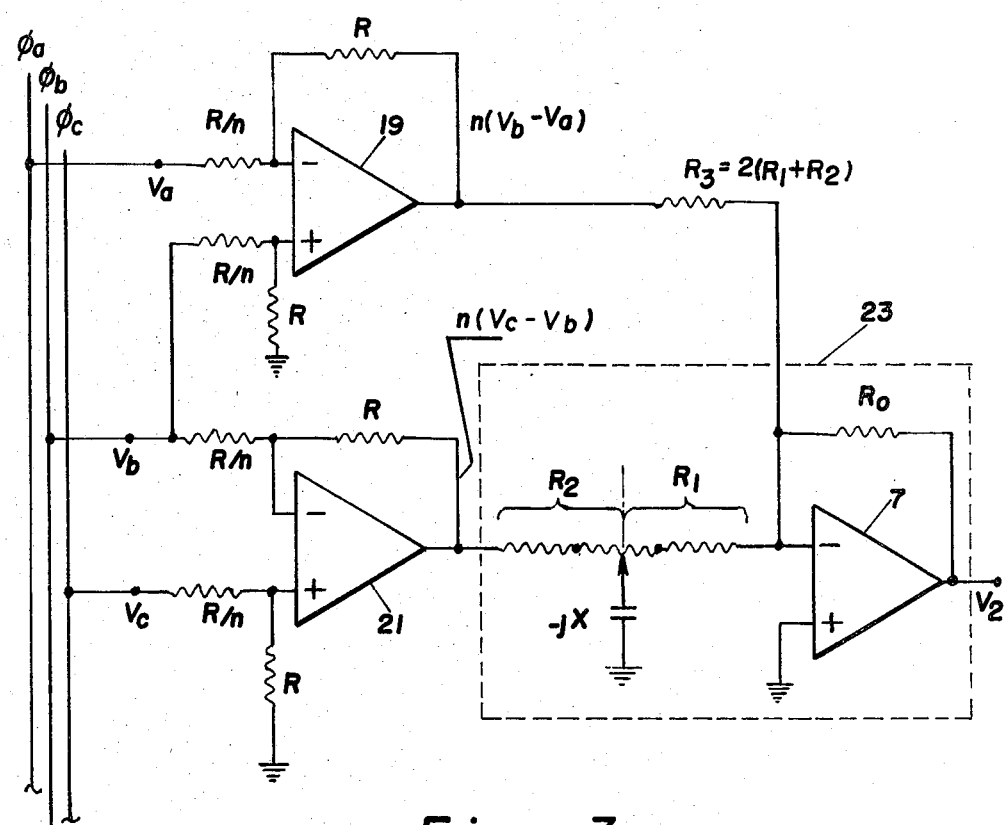
FIG. 3 is a schematic diagram of a sequence filter constructed in accordance with the teachings of the invention.

The above described phase shifting circuit can be used in several different circuit combinations to generate the negative sequence voltage. FIG. 3 illustrates a first arrangement in which the line-to-neutral voltages $V_a$ and $V_b$ are applied to the differential inputs of an operational amplifier 19 to generate a first line-to-line voltage and the line-to-neutral voltages $V_b$ and $V_c$ are similarly applied to the inverting inputs of a second operational amplifier 21 to generate the second line-to-line voltage. This second line-to-line voltage $V_{cb}$ is applied to the phase shifting network 23 described above to bring the voltage into phase with the first line-to-line voltage. The two line-to-line voltages are then added together by applying the output of operational amplifier 19 to the inverting input of operational amplifier 7 of the phase shifting circuit together with the phase shifted output of operational amplifier 21. The values of the resistors in the circuit of FIG. 2 are shown on the drawing. The output voltage of this circuit is as follows:

$$V_2 = [(V_a - V_b) + h(V_c - V_b)] \cdot \frac{nR_0}{2(R_1 + R_2)} \tag{14}$$

As can be seen from equation (14), if the three phase system is in balance the negative sequence voltage $V_2$ will be equal to zero. On the other hand, any imbalance in the system will generate a finite value for $V_2$ which may be detected by any suitable device connected to the output of the circuit of FIG. 2 and used appropriately.

Figure 4:
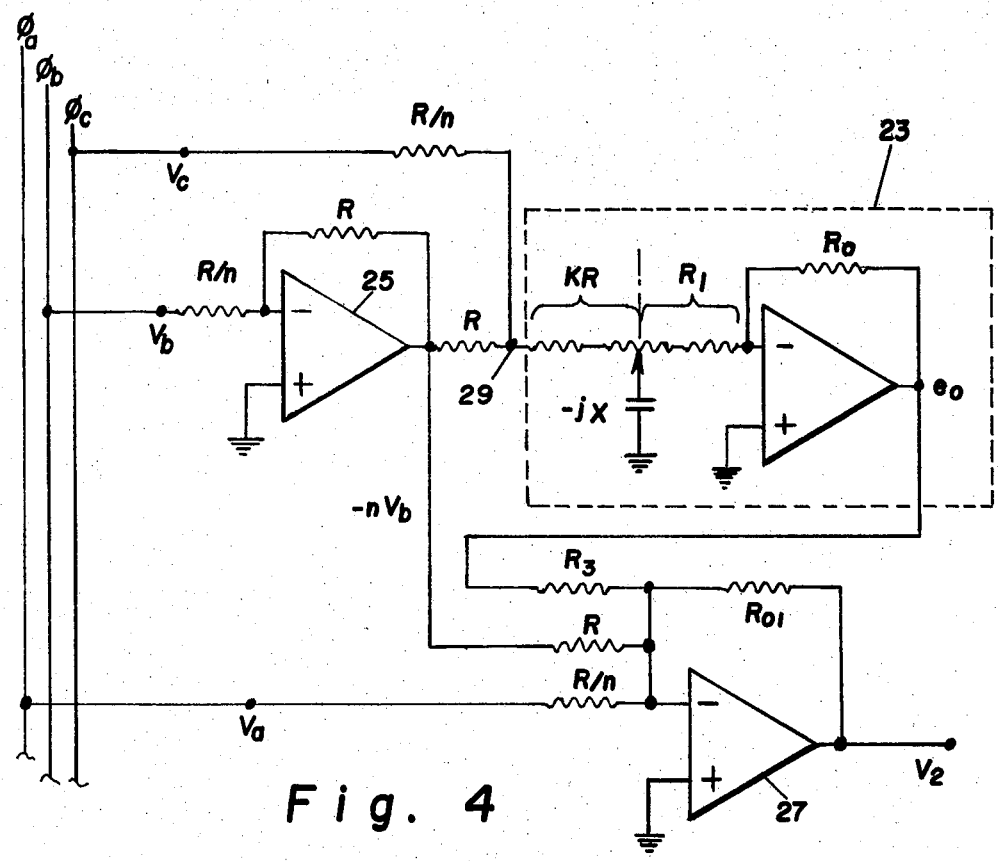
FIG. 4 is a schematic diagram of another embodiment of the invention.

FIG. 4 illustrates another embodiment of the invention which avoids the common mode voltage variation of the operational amplifiers. In this circuit, the line-to-neutral voltages $V_b$ and $V_a$ are applied to the inverting inputs of operational amplifiers 25 and 27 respectively. The output voltage $-nV_b$ generated by the operational amplifier 25 is summed with the line-to-neutral voltage $V_a$ at the inverting input of operational amplifier 27 to generate the first line-to-line voltage. The voltage $-nV_b$ is also summed with the third line-to-neutral voltage $V_c$ at node 29 to generate the other line-to-line voltage V which is shifted 120° by phase shifting circuit 23 and then summed with the first line-to-line voltage at the summing input of operational amplifier 27.

The output of the phase shifting circuit 23 in FIG. 4 is determined as follows:

$$e_o = \frac{h}{2} \frac{R_0}{R_1 + R_2} \cdot V \tag{15}$$

Where:

$$V = \frac{n}{n+1} (V_c - V_b) \tag{16}$$

$$R_1 = (1 - K)R \quad [0 \leq K \leq 1] \tag{17}$$

$$R_2 = \frac{1 + K(n+1)}{n+1} \cdot R \tag{18}$$

And thus $$e_o = \frac{h}{2} \cdot \frac{nR_0}{R(n+2)} \cdot (V_c - V_b) \tag{19}$$

When this phase shifted line-to-line voltage is added to the first line-to-line voltage at operational amplifier 27, the negative sequence voltage generated at the output of operational amplifier 27 is derived as follows:

$$-V_2 = V_a \frac{nR_{01}}{R} - V_b \frac{nR_{01}}{R} + \tag{20}$$

$$\frac{h}{2} \cdot \frac{nR_0}{R(n+2)} \cdot \frac{R_{01}}{R_3} \cdot (V_c - V_b)$$

where:

$$R_3 = \frac{R_0}{2(n+2)} \tag{21}$$

So that:

$$-V_2 = [V_a - V_b + h(V_c - V_b)] \frac{nR_{01}}{R} \tag{22}$$

Figure 5:
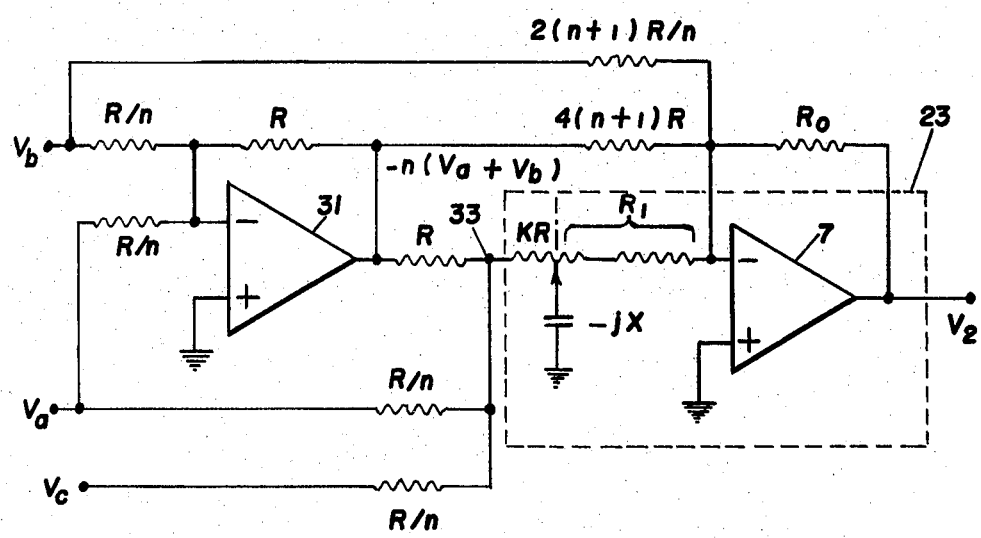
FIG. 5 is a schematic diagram of yet a third embodiment of the invention.

Yet another embodiment of the invention is illustrated in FIG. 5 which employs only one operational amplifier in addition to the one incorporated in the phase shifting circuit. In this arrangement, the line-to-neutral voltages $V_a$ and $V_b$ are summed at the inverting input of operational amplifier 31. The line-to-line voltage $V_{cb}$ is generated at node 33 by summing the inverted output of the operational amplifier 31 with the line-to-neutral voltages $V_a$ and $V_c$. The line-to-line voltage $V_{cb}$ is then phase shifted 120° by the phase shifting circuit 23. The output of operational amplifier 31, which is equal to $-n(V_a+V_b)$, is then summed with the appropriately weighted line-to-neutral voltage $V_b$ at the inverting input to the operational amplifier 7 of the phase shifting circuit 23 to generate the line-to-line voltage $V_{ab}$ which in turn is summed with the phase shifted voltage $V_{cb}$ to produce the negative sequence voltage.

The equations for this circuit may be developed as follows. The output voltage of the phase shifting circuit 23 which is the negative sequence voltage has two components, $e_o'$ which is the output voltage attributable to the line-to-line voltage $V_{cb}$ applied to the input of the phase shifting circuit 23 at node 33, and the line-to-line voltage $V_{ab}$ which is applied to the inverting input of the operational amplifier 7 of the phase shifting circuit. These voltages are determined as follows:

$$e'_o = \frac{h}{2} \frac{R_0}{R_1 + R_2} V \tag{23}$$

where V is the voltage at node 33, and:

$$V_2 = \frac{n(V_a + V_c) - n(V_a + V_b)}{2n + 1} = \frac{n}{2n + 1} (V_c - V_b) \tag{24}$$

$$R_1 = (1 - K)R \quad (0 \leq K \leq 1) \tag{25}$$

$$R_2 = \frac{R}{2n + 1} + KR \tag{26}$$

So that:

$$e'_o = h(V_c - V_b)\frac{n}{4(n+1)} \cdot \frac{R_0}{R} \quad (27)$$

On the otherhand $$e''_o = \frac{R_0}{4(n+1)R} \cdot n(V_a + V_b) - \frac{R_0 n}{2(n+1)R} V_b \quad (28)$$

or $$e''_o = \frac{n}{4(n+1)}(V_a - V_b)\frac{R_0}{R} \quad (29)$$

And therefore the negative sequence voltage equals the sum of equations 27 and 29, and:

$$V_2 = [(V_a - V_b) + h(V_c - V_b)]\frac{n}{4(n+1)} \cdot \frac{R_0}{R} \quad (30)$$

Although the circuits of FIGS. 3 through 5 differ in detail, they all generate the two appropriate line-to-line voltages, then phase shift one of them to bring it into phase with the other, and finally sum the resultant signals to produce the negative sequence voltage. Likewise, all of these circuits only employ a single reactive element, the capacitor C, which greatly simplifies tuning. Furthermore, the tuning arrangement used provides cost advantages since a precision potentiometer which is less costly than a precision capacitor is employed to compensate for variations in the value of the capacitor. Additionally, the circuits require no transformers and due to the high input and low output impedances of the operational amplifiers, the circuits dissipate very little power.

It should also be evident to those skilled in the art that since the positive sequence voltage is defined as:

$$V_{1a} = \tfrac{1}{3}[V_a + h V_b + h^2 V_c] \quad (31)$$

the order in which the voltages are applied to the circuits of FIGS. 3 through 5 can be modified such that the positive sequence voltages are generated.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for generating the positive or negative sequence voltage from a three phase AC source voltage, said apparatus comprising:
   means for generating a first line-to-line voltage as the difference between a first two of the source voltages;
   means for generating a second line-to-line voltage as the difference between one of said first two source voltages and the third source voltage;
   means for phase shifting one of said line-to-line voltages 120° to bring it into phase with the other line-to-line voltage, said means including a potentiometer having a tap point, a capacitor connected between the tap point and ground, means for connecting said first line-to-line voltage to one end of the potentiometer, an operational amplifier and means connecting the other end of the potentiometer to the inverting input of the operational amplifier;
   means for summing said phase shifted line-to-line voltage and said other line-to-line voltage to produce said positive or negative sequence voltage; and
   wherein said means for generating said first line-to-line voltage includes a second operational amplifier, means for applying one of said source voltages to the inverting input thereof, a non-reactive impedance connected in series with the output of said second operational amplifier and a junction and means for applying a second source voltage to said junction, wherein said junction is connected to the first end of said potentiometer in said phase shifting means to shift said first line-to-line voltage 120° in phase, wherein said means for generating said second line-to-line voltage includes a third operational amplifier and means for applying the third source voltage and the output of said first operational amplifier to the inverting input of said third operational amplifier and wherein said means for summing said phase shifted line-to-line voltage with the second line-to-line voltage includes means for applying the output of the operational amplifier in the phase shifting means to the inverting input of the third operational amplifier.

2. Apparatus for generating the positive or negative sequence voltage from a three phase AC source voltage, said apparatus comprising:
   means for generating a first line-to-line voltage as the difference between a first two of the source voltages;
   means for generating a second line-to-line voltage as the difference between one of said first two source voltages and the third source voltage;
   means for phase shifting one of said line-to-line voltages 120° to bring it into phase with the other line-to-line voltage, said means including a potentiometer having a tap point, a capacitor connected between the tap point and ground, means for connecting said first line-to-line voltage to one end of the potentiometer, an operational amplifier and means connecting the other end of the potentiometer to the inverting input of the operational amplifier;
   means for summing said phase shifted line-to-line voltage and said other line-to-line voltage to produce said positive or negative sequence voltage; and
   wherein said means for generating said first line-to-line voltage includes a second operational amplifier, means for connecting first and second of said source voltages to the inverting input of said second operational amplifier, a non-reactive impedance connected in series with the output of said second operational amplifier and a junction, and means for applying the first and third source voltages to said junction, wherein said junction is connected to the first end of said potentiometer in said phase shifting means to shift said first line-to-line voltage 120° in phase, wherein said means for generating said second line-to-line voltage and for summing said second line-to-line voltage with the phase shifted first line-to-line voltage includes means for applying the output of said second operational amplifier and said second source voltage to the inverting input of the operational amplifier in said phase shifting circuit.

3. Apparatus for generating the positive or negative sequence voltages from a three phase AC source voltage, said apparatus comprising:
a first operational amplifier;
means for applying one of said source voltages to the inverting input of said operational amplifier;
a resistive impedance connected in series between the output of said first operational amplifier and a junction;
means for applying a second of said source voltages to said junction;
means for shifting the voltage generated at said junction 120° in phase;
a second operational amplifier; and
means for applying the third source voltage, the output of the first operational amplifier and the output of the phase shifting means to the inverting input of the second operational amplifier.

4. The apparatus of claim 9 wherein said phase shifting means includes a third operational amplifier at the output thereof with the output of said third operational amplifier connected to the inverting input of said second operational amplifier.

5. Apparatus for generating the positive or negative sequence voltages from a three phase AC source voltage, said apparatus comprising:
a first operational amplifier;
means for applying a first and second of said source voltage to the inverting input of said first operational amplifier;
a resistive impedance connected in series to the output of said first operational amplifier and a junction;
means for applying the first and third source voltages to said junction;
means for shifting the voltage generated at said junction 120° in phase;
a second operational amplifier;
means connecting the output of said phase shifting means to the inverting input of said second operational amplifier; and
means for also applying the output of said first operational amplifier and the second source voltage to the inverting input of said second operational amplifier.

* * * * *